(12) United States Patent
Zhang et al.

(10) Patent No.: US 12,408,549 B2
(45) Date of Patent: Sep. 2, 2025

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Bo Zhang, Beijing (CN); Zhenggang Wu, Beijing (CN); Rong Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 708 days.

(21) Appl. No.: 17/771,502

(22) PCT Filed: Jul. 5, 2021

(86) PCT No.: PCT/CN2021/104546
§ 371 (c)(1),
(2) Date: Apr. 25, 2022

(87) PCT Pub. No.: WO2022/037287
PCT Pub. Date: Feb. 24, 2022

(65) Prior Publication Data
US 2022/0406875 A1    Dec. 22, 2022

(30) Foreign Application Priority Data
Aug. 18, 2020   (CN) .................. 202010831194.5

(51) Int. Cl.
*H10K 59/131*    (2023.01)
*H10K 59/121*    (2023.01)
*H10K 85/60*     (2023.01)

(52) U.S. Cl.
CPC ....... *H10K 85/631* (2023.02); *H10K 59/1213* (2023.02); *H10K 59/1216* (2023.02); *H10K 59/131* (2023.02)

(58) Field of Classification Search
CPC ............. H10K 59/131; H10K 59/1213; H10K 59/1216; H10K 30/81; H10K 85/40; H10K 85/631; G02F 1/13452; G02F 1/136286
See application file for complete search history.

(56) References Cited

U.S. PATENT DOCUMENTS

2009/0033609 A1    2/2009   Ashizawa et al.
2014/0022148 A1    1/2014   Kim et al.
(Continued)

FOREIGN PATENT DOCUMENTS

CN    101359142 A    2/2009
CN    105158998 A    12/2015
(Continued)

OTHER PUBLICATIONS

Lao; Xun, CN-110858601-A, Machine Translation (Year: 2020).*
(Continued)

*Primary Examiner* — Andres Munoz
*Assistant Examiner* — Grace Cha
(74) *Attorney, Agent, or Firm* — Ling Wu; Stephen Yang; Ling and Yang Intellectual Property

(57) ABSTRACT

A display substrate and a display apparatus are provided. The display substrate includes: a display region and a non-display region, the non-display region including a fan-out region and a bending region; a plurality of sub-pixels located in the display region; a plurality of first data signal lines located in the display region and electrically connected with the plurality of sub-pixels; a plurality of fan-out wires located in the fan-out region; a plurality of second data
(Continued)

signal lines located in the bending region; and a plurality of transfer lines located in the fan-out region and between the plurality of fan-out wires and the plurality of second data signal lines, wherein a ratio of a width of at least part of the plurality of transfer lines to a width of the plurality of fan-out wires is 0.5 to 5.5.

19 Claims, 10 Drawing Sheets

(56) References Cited

U.S. PATENT DOCUMENTS

| | | | |
|---|---|---|---|
| 2018/0342707 A1* | 11/2018 | Lee | H10K 77/111 |
| 2020/0013848 A1* | 1/2020 | Moon | H10D 86/00 |
| 2021/0111191 A1 | 4/2021 | Zeng et al. | |

FOREIGN PATENT DOCUMENTS

| | | | |
|---|---|---|---|
| CN | 107121860 A | | 9/2017 |
| CN | 109100914 A | | 12/2018 |
| CN | 109212852 A | | 1/2019 |
| CN | 109449169 A | | 3/2019 |
| CN | 109459875 A | | 3/2019 |
| CN | 109491121 A | | 3/2019 |
| CN | 109656067 A | | 4/2019 |
| CN | 109860253 A | | 6/2019 |
| CN | 110515499 A | | 11/2019 |
| CN | 110858601 A | * | 3/2020 |
| CN | 110931515 A | | 3/2020 |
| CN | 210805177 U | | 6/2020 |
| CN | 111933674 A | | 11/2020 |

OTHER PUBLICATIONS

International Search Report for PCT/CN2021/104546 Mailed Sep. 17, 2021.

Office Action dated Nov. 10, 2023 for Chinese Patent Application No. 202010831194.5 and English Translation.

* cited by examiner

DISPLAY SUBSTRATE AND DISPLAY DEVICE

CROSS-REFERENCE TO RELATED APPLICATIONS

The present application is a U.S. National Phase Entry of International Application No. PCT/CN2021/104546 having an international filing date of Jul. 5, 2021, which claims the priority of Chinese Patent Application No. 202010831194.5, filed to the CNIPA on Aug. 18, 2020 and entitled "Display Substrate and Display Device". The entire contents of the above-identified applications are hereby incorporated by reference.

TECHNICAL FIELD

Embodiments of the present disclosure relate to, but are not limited to, the field of display technology, particularly to a display substrate and a display apparatus.

BACKGROUND

With the development of display technology, display substrates have been widely used in the field of display technology, and are also evolving towards high resolution. A display substrate includes a display region and a non-display region. The non-display region is provided with a driving circuit to output signals, and the display region is provided with a display structure layer to display pictures. The non-display region is also provided with wires for transmitting corresponding signals to the display region.

The wires located in the non-display region are designed to converge towards the driving circuit in the non-display region, such that the wires are gathered into a fan-like structure. This region is commonly referred to as a fan-out region. The higher the screen resolution of a display substrate is, the more the wires located in the fan-out region are.

SUMMARY

The following is a summary about the subject matter described in the present disclosure in detail. The summary is not intended to limit the protection scope of the claims.

In a first aspect, the present disclosure provides a display substrate, including: a display region and a non-display region surrounding the display region, the non-display region including a fan-out region and a bending region, the bending region being located at a side of the fan-out region away from the display region; a plurality of sub-pixels located in the display region; a plurality of first data signal lines, located in the display region, electrically connected with the plurality of sub-pixels, and configured to provide data signals to the plurality of sub-pixels; a plurality of fan-out wires, located in the fan-out region and arranged sequentially along a first direction, the plurality of fan-out wires being electrically connected with the plurality of first data signal lines; a plurality of second data signal lines, located in the bending region and arranged sequentially along the first direction, the plurality of second data signal lines being electrically connected with the plurality of fan-out wires; and a plurality of transfer lines, located in the fan-out region and between the plurality of fan-out wires and the plurality of second data signal lines, the plurality of transfer lines electrically connecting the plurality of fan-out wires with the plurality of second data signal lines, wherein a ratio of a width of at least part of the plurality of transfer lines to a width of the plurality of fan-out wires is 0.5 to 5.5.

In some possible implementations, at least one of the plurality of fan-out wires includes: a first connecting portion, a second connecting portion and a third connecting portion arranged along a second direction, the second connecting portion being located between the first connecting portion and the third connecting portion and connecting the first connecting portion with the third connecting portion, an angle between the first connecting portion and the second connecting portion being greater than 90 degrees and smaller than or equal to 180 degrees, and an angle between the second connecting portion and the third connecting portion being greater than 90 degrees and smaller than or equal to 180 degrees; a ratio of a width of the third connecting portion to the width of the at least part of the transfer lines being 1 to 2; and the first direction intersecting the second direction.

In some possible implementations, a ratio of the width of the at least part of the transfer lines to a width of at least part of second connecting portions is 2 to 5.5.

In some possible implementations, the width of the at least part of the transfer lines is equal to the width of the third connecting portion.

In some possible implementations, the display region is in a shape of a rounded polygon, the display region is divided into a straight edge region and a corner region, a boundary of the display region in the corner region is arc-shaped, and a ratio of a width of the first connecting portion to a width of the second connecting portion in a fan-out wire close to the corner region is 2 to 5.5.

In some possible implementations, a ratio of the width of the first connecting portion of the fan-out wire close to the corner region to a width of a first data signal line is 2 to 3.

In some possible implementations, an $i^{th}$ fan-out wire is arranged in a different layer from an $(i+1)^{th}$ fan-out wire, $1 \le i \le N$, N being a quantity of the fan-out wires; and a transfer line is arranged in a same layer as a fan-out wire connected with the transfer line.

In some possible implementations, fan-out wires of odd ordinal numbers are arranged in a same layer and fan-out wires of even ordinal numbers are arranged in a same layer.

In some possible implementations, the display substrate further includes a plurality of first connecting electrodes located in the display region, the plurality of first connecting electrodes are respectively connected with the plurality of first data signal lines and the plurality of fan-out wires; and a first connecting electrode is arranged in a same layer as a fan-out wire connected with the first connecting electrode, and in a different layer from a first data signal line connected with the first connecting electrode.

In some possible implementations, the display substrate further includes a plurality of second connecting electrodes located in the bending region, the plurality of second connecting electrodes are respectively electrically connected with the plurality of transfer lines and the plurality of second data signal lines; a second connecting electrode is arranged in a same layer as a transfer line connected with the second connecting electrode, and in a different layer from a second data signal line connected with the second connecting electrode; and a ratio of a width of the second connecting electrode to a width of the transfer line connected with the second connecting electrode is 0.8 to 1; and a ratio of a width of the second data signal line to the width of the second connecting electrode connected with the second data signal line is 1 to 1.2.

In some possible implementations, the display substrate further includes an underlay substrate on which the plurality of sub-pixels are arranged, at least one of the plurality of sub-pixels includes a driving thin film transistor and a storage capacitor; the driving thin film transistor includes a driving active layer located on the underlay substrate, a first insulating layer located on a side of the driving active layer away from the underlay substrate, a driving gate electrode located on a side of the first insulating layer away from the underlay substrate, a second insulating layer located on a side of the driving gate electrode away from the underlay substrate, a third insulating layer located on a side of the second insulating layer away from the underlay substrate, and a driving source electrode and a driving drain electrode located on a side of the third insulating layer away from the underlay substrate; and the storage capacitor includes a first plate and a second plate; the first plate is arranged in a same layer as the driving gate electrode, the second plate is located between the second insulating layer and the third insulating layer, and an orthographic projection of the first plate on the underlay substrate at least partially overlaps with an orthographic projection of the second plate on the underlay substrate.

In some possible implementations, the fan-out wires of odd ordinal numbers are arranged in a same layer as the first plate, and the fan-out wires of even ordinal numbers are arranged in a same layer as the second plate; or, the fan-out wires of odd ordinal numbers are arranged in a same layer as the second plate, and the fan-out wires of even ordinal numbers are arranged in a same layer as the first plate; there is no overlapping area between an orthographic projection of the $i^{th}$ fan-out wire on the underlay substrate and an orthographic projection of the $(i+1)^{th}$ fan-out wire on the underlay substrate.

In some possible implementations, the first data signal lines and the second data signal lines are arranged in a same layer as the driving source electrode.

In some possible implementations, the plurality of second data signal lines are provided with a plurality of through holes; and the plurality of through holes are round holes or elliptical holes.

In some possible implementations, the display substrate further includes a driving chip and a plurality of third data signal lines located at a side of the bending region away from the fan-out region; and the driving chip is electrically connected with the plurality of second data signal lines through the plurality of third data signal lines.

In a second aspect, the present disclosure further provides a display apparatus, including the display substrate described above.

Other aspects will become apparent upon reading and understanding accompanying drawings and the detailed description.

BRIEF DESCRIPTION OF DRAWINGS

Accompanying drawings are used for providing an understanding of technical solutions of the present disclosure and form a part of the specification, and together with embodiments of the present disclosure, are used for explaining the technical solutions of the present disclosure, but do not constitute a limitation on the technical solutions of the present disclosure.

DETAILED DESCRIPTION

Figure 1:
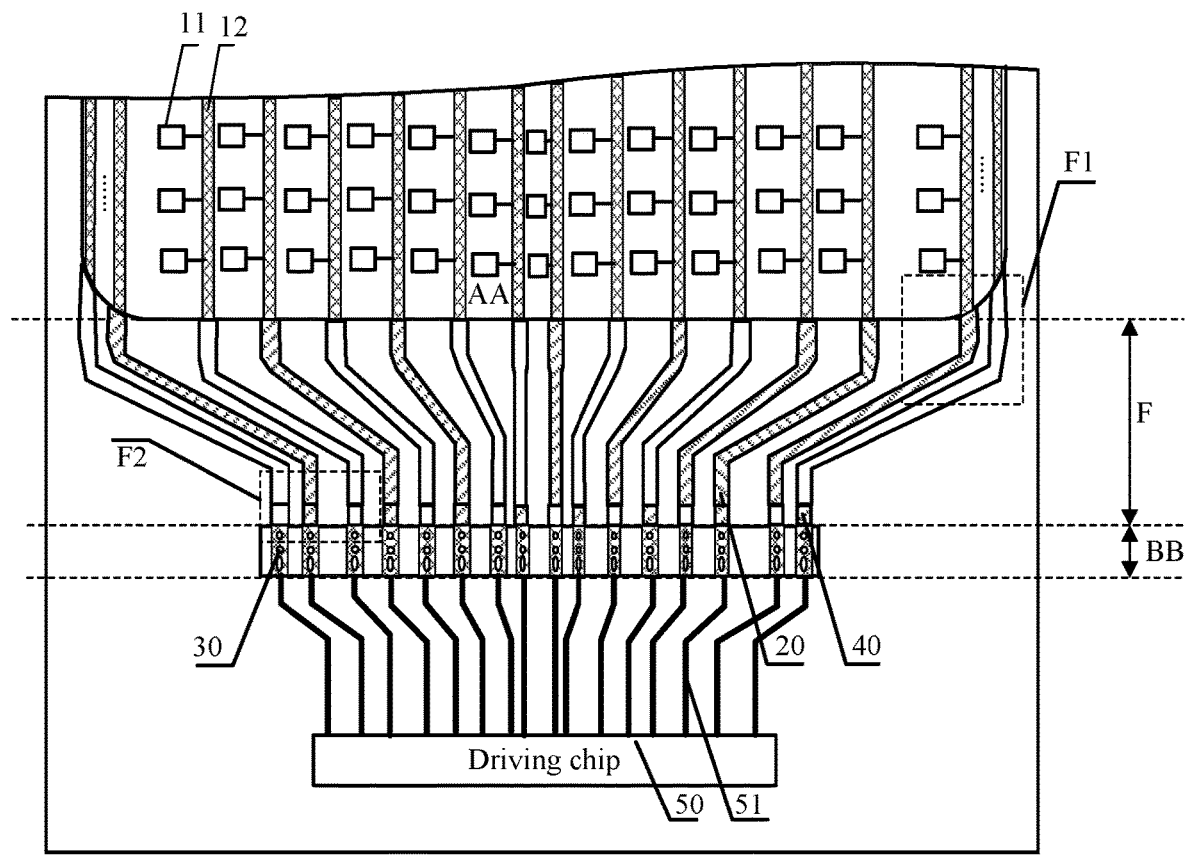
FIG. 1 is a schematic diagram of a structure of a display substrate according to an embodiment of the present disclosure.

Embodiments of the present disclosure will be described below in detail with reference to the accompanying drawings. The embodiments in the present disclosure and features in the embodiments may be combined with each other arbitrarily if there is no conflict.

Multiple embodiments are described in the present disclosure, but the description is exemplary rather than limiting, and for those of ordinary skills in the art, there may be more embodiments and implementation solutions within the scope of the embodiments described in the present disclosure. Although many possible combinations of features are shown in the drawings and discussed in the Detailed Description, many other combinations of the disclosed features are also possible. Unless specifically limited, any feature or element of any embodiment may be used in combination with or in place of any other feature or element of any other embodiment.

The present disclosure includes and contemplates combinations with features and elements known to those of ordinary skills in the art. Embodiments, features and elements already disclosed in this disclosure may also be combined with any conventional features or elements to form a technical solution defined by the claims. Any feature or element of any embodiment may also be combined with features or elements from other technical solutions to form another technical solution defined by the claims. Therefore, it should be understood that any of the features shown and discussed in the present disclosure may be implemented individually or in any suitable combination. Therefore, the embodiments are not otherwise limited except the limitation in accordance with the appended claims and equivalents thereof. In addition, various modifications and changes may be made within the protection scope of the appended claims.

Unless otherwise defined, technical terms or scientific terms used in the present disclosure shall have common meanings as construed by those of ordinary skills in the art to which the present disclosure pertains. The words "first", "second" and the like used in the present disclosure do not represent any order, quantity or importance, but are merely used to distinguish among different components. The word such as "including", "comprising", or the like means that an element or article preceding the word covers elements or articles listed after the word and their equivalents, and does not exclude other elements or articles. The term such as "connect", "link", or the like is not limited to physical or mechanical connection, but may include an electrical connection, either direct or indirect. "Up", "down", "left", "right", etc. are only used to represent a relative position relationship that may change accordingly when an absolute position of an object being described changes.

In a display product, wires in a fan-out region include wires that provide data signals to data signal lines in a display region. In the fan-out region, the wires providing data signals to the data signal lines in the display region are sparsely arranged in a vertical direction and densely arranged in a horizontal direction.

In a display product, the wires in the fan-out region that provide data signals to the data signal lines in the display region are easy to break, resulting in display abnormalities and reducing the product yield of the display product.

FIG. 1 is a schematic diagram of a structure of a display substrate according to an embodiment of the present disclosure. As shown in FIG. 1, the display substrate according to an embodiment of the present disclosure includes: a display region AA and a non-display region surrounding the display region AA. The non-display region includes a fan-out region F and a bending region BB, the bending region BB being located at a side of the fan-out region F away from the display region AA. The display substrate includes: a plurality of sub-pixels 11, a plurality of first data signal lines 12, a plurality of fan-out wires 20, a plurality of second data signal lines 30, and a plurality of transfer lines 40.

The plurality of sub-pixels 11 are located in the display region AA. The plurality of first data signal lines 12 are located in the display region AA, are electrically connected with the plurality of sub-pixels 11, and are configured to provide data signals to the plurality of sub-pixels 11. The plurality of fan-out wires 20 are located in the fan-out region F and arranged sequentially along a first direction. The plurality of fan-out wires 20 are electrically connected with the plurality of first data signal lines 12. The plurality of second data signal lines 30 are located in the bending region BB and arranged sequentially along the first direction. The plurality of second data signal lines 30 are electrically connected with the plurality of fan-out wires 20. The plurality of transfer lines 40 are located in the fan-out region F and between the plurality of fan-out wires 20 and the plurality of second data signal lines 30. The plurality of transfer lines 40 electrically connect the plurality of fan-out wires 20 with the plurality of second data signal lines 30.

In an exemplary embodiment, a ratio of the width of at least part of the plurality of transfer lines to the width of the plurality of fan-out wires is 0.5 to 5.5.

In an exemplary embodiment, the display region may include: scan signal lines, light emitting control lines and reset signal lines. The plurality of sub-pixels are defined by the cross of the scan signal lines and the first data signal lines. Each sub-pixel includes a plurality of transistors, the plurality of transistors may constitute a pixel circuit, and the pixel circuit is electrically connected with a scan signal line, a first data signal line, a light emitting control line and a reset signal line.

In an exemplary embodiment, the transistors used in the pixel circuit may each be a thin film transistor, a field effect transistor, or another switch device with the same characteristics.

In an exemplary embodiment, the display substrate may be a liquid crystal display substrate, or may be an Organic Light-Emitting Diode (OLED) display substrate.

In an exemplary embodiment, the liquid crystal display substrate may be an array substrate, or may be a Color Filter on Array (COA) type array substrate.

In an exemplary embodiment, when the display substrate is an OLED display substrate, the display substrate may further include: a light emitting element. The light emitting element may include: a first electrode, a second electrode and an organic light emitting layer. The first electrode and the second electrode are located on two sides of the organic light emitting layer, respectively.

In an exemplary embodiment, when the display substrate is a liquid crystal display substrate, a display apparatus may further include: a pairing substrate configured to be paired with the display substrate. When the display substrate is an array substrate, the pairing substrate may be a color filter substrate. When the display substrate is a COA type array substrate, the pairing substrate may be a glass cover plate.

In an exemplary embodiment, the display region of the display substrate may be in a shape of a rounded polygon, which is not limited in the embodiments of the present disclosure. FIG. 1 illustrates an example in which the display region of the display substrate is a rounded quadrilateral.

In an exemplary embodiment, the fan-shaped wires may be linear or zigzag. The linear wires are located in the middle region of the fan-shaped region, and the number of linear wires among the fan-shaped wires is at least one, which is determined according to the wiring mode of the fan-shaped region of the display substrate. The zigzag wires among the fan-shaped wires are located in regions at two sides of the middle region of the fan-shaped region.

In an exemplary embodiment, the width of at least part of the transfer lines may be 4 microns to 8 microns.

The display substrate according to the embodiment of the present disclosure includes: a display region and a non-display region surrounding the display region, the non-display region including a fan-out region and a bending region, the bending region being located at a side of the fan-out region away from the display region; a plurality of sub-pixels located in the display region; a plurality of first data signal lines located in the display region, electrically connected with the plurality of sub-pixels, and configured to provide data signals to the plurality of sub-pixels; a plurality of fan-out wires located in the fan-out region and arranged sequentially along a first direction, the plurality of fan-out wires being electrically connected with the plurality of first data signal lines; a plurality of second data signal lines located in the bending region and arranged sequentially along the first direction, the plurality of second data signal lines being electrically connected with the plurality of fan-out wires; and a plurality of transfer lines located in the fan-out region and between the plurality of fan-out wires and the plurality of second data signal lines, the plurality of transfer lines electrically connecting the plurality of fan-out wires with the plurality of second data signal lines, and a ratio of the width of at least part of the plurality of transfer lines to the width of the plurality of fan-out wires being 0.5 to 5.5. In the present disclosure, by setting the ratio of the width of at least part of the plurality of transfer lines to the width of the plurality of fan-out wires to 0.5 to 5.5, the reliability of the fan-out wires may be improved, thereby avoiding the technical problem that the fan-out wires are easy to break in the manufacturing process, and improving the yield of the display product.

In an exemplary embodiment, as shown in FIG. 1, the display substrate may further include: a driving chip 50 and a plurality of third data signal lines 51. The driving chip 50 is electrically connected with the plurality of second data signal lines 30 through the plurality of third data signal lines 51.

In an exemplary embodiment, the driving chip includes: a first driving chip that provides signals to the scan signal lines, the light emitting control lines and the reset signal lines, and a second driving chip that provides signals to the third data signal lines.

In an exemplary embodiment, the scan signal lines, the reset signal lines and the light emitting control lines are arranged in the same layer.

Figure 2:
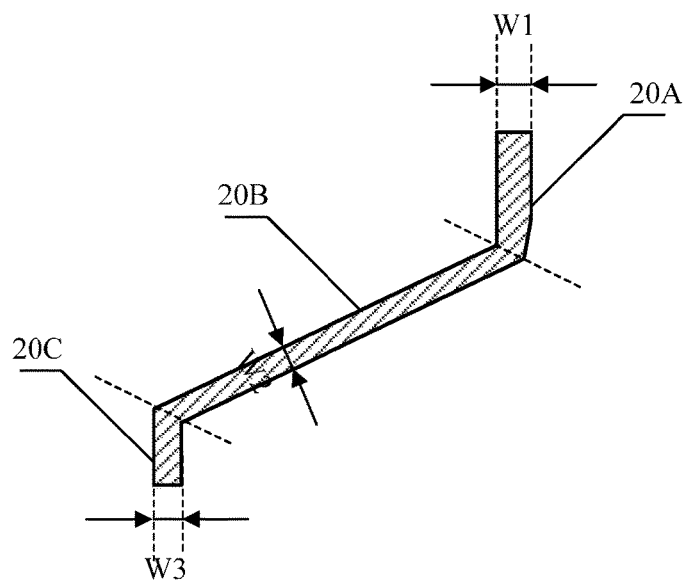
FIG. 2 is a schematic diagram of a structure of a fan-out wire according to an embodiment of the present disclosure.

FIG. 2 is a schematic diagram of a structure of a fan-out wire according to an exemplary embodiment. As shown in FIG. 2, at least one fan-out wire 20 of the plurality of fan-out wires includes: a first connecting portion 20A, a second connecting portion 20B and a third connecting portion 20C arranged along a second direction. The second connecting portion 20B is located between the first connecting portion 20A and the third connecting portion 20C and connects the first connecting portion 20A with the third connecting portion 20C.

An angle between the first connecting portion 20A and the second connecting portion 20B is greater than 90 degrees and smaller than or equal to 180 degrees. An angle between the second connecting portion 20B and the third connecting portion 20C is greater than 90 degrees and smaller than or equal to 180 degrees.

The first connecting portion 20A is respectively electrically connected with a first data signal line and the second connecting portion 20B, and the third connecting portion 20C is respectively electrically connected with the second connecting portion 20B and a transfer line 40. A ratio of the width W3 of the third connecting portion to the width of at least part of the transfer lines is 1 to 2.

In an exemplary embodiment, the first direction intersects the second direction. The first direction intersecting the second direction means that an angle between the first direction and the second direction may be about 70 degrees to 90 degrees. For example, the angle between the first direction and the second direction may be 90 degrees, i.e., the first direction may be perpendicular to the second direction.

In an exemplary embodiment, the first connecting portion 20A and the third connecting portion 20C extend in the second direction.

In an exemplary embodiment, the width W1 of the first connecting portion 20A may be about 4 microns to 6 microns.

In an exemplary embodiment, the width W2 of the second connecting portion 20B may be about 1.5 microns to 2 microns.

In an exemplary embodiment, the width W3 of the third connecting portion 20C may be greater than or equal to 8 microns.

In an exemplary embodiment, as shown in FIG. 2, the width W3 of the third connecting portion 20C is greater than or equal to the width W2 of the second connecting portion 20B, which may improve the reliability of the fan-out wire, avoiding the technical problem that fan-out wires are easy to break during the manufacturing process, and may improve the display effect of the display product, improving the yield of the display product.

In an exemplary embodiment, the width of at least part of the transfer lines may be equal to the width of the third connecting portion.

Since the ratio of the width of the third connecting portion to the width of at least part of the transfer lines is 1 to 2, in an exemplary embodiment, the width of at least part of the transfer lines is greater than half of the width W3 of the third connecting portion. The width of the part of the transfer lines is increased and the yield of the display product is improved.

In an exemplary embodiment, the width of at least part of the transfer lines is equal to the width of the third connecting portion.

In an exemplary embodiment, a ratio of the width of at least part of the transfer lines to the width W2 of at least part of the second connecting portions is 2 to 5.5.

In an exemplary embodiment, the display region is in a shape of a rounded polygon, the display region is divided into a straight edge region and a corner region, a boundary of the display region in the corner region is arc-shaped, and a ratio of the width of the first connecting portion to the width of the second connecting portion in a fan-out wire close to the corner region is 2 to 5.5.

In an exemplary embodiment, a ratio of the width of the first connecting portion of a fan-out wire close to the corner region to the width of the first data signal line is 2 to 3.

In an exemplary embodiment, for N fan-out wires 20 located in the fan-out region F and sequentially arranged along the first direction, the $i^{th}$ fan-out wire is arranged in a different layer from the $(i+1)^{th}$ fan-out wire, $1 \leq i \leq N$.

In an exemplary embodiment, a transfer line is arranged in the same layer as the fan-out wire connected with the transfer line.

In an exemplary embodiment, the fan-out wires of odd ordinal numbers are arranged in the same layer and the fan-out wires of even ordinal numbers are arranged in the same layer.

Figure 3:
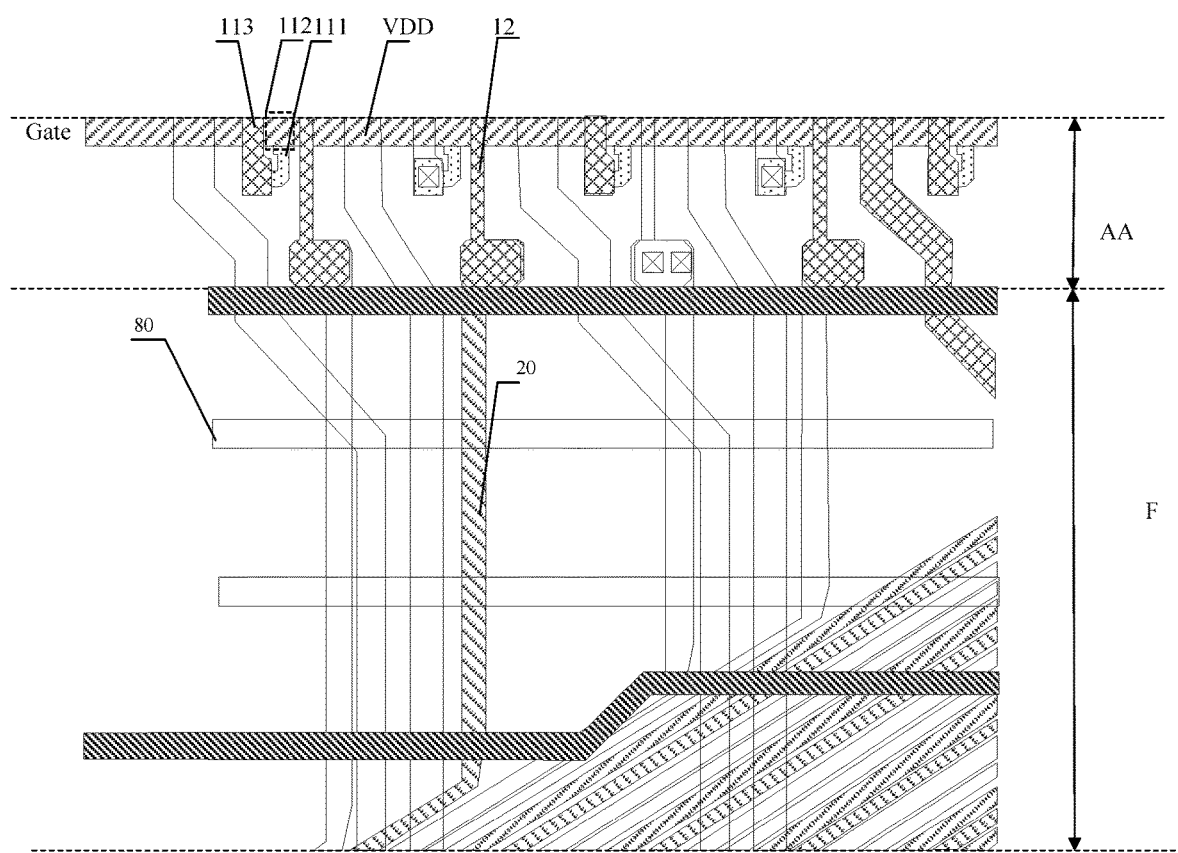
FIG. 3 is a schematic diagram of a structure of an F1 region in a display substrate according to an exemplary embodiment.

In an exemplary embodiment, FIG. 3 is a structural layout of an F1 region in a display substrate according to an exemplary embodiment. As shown in FIG. 3, the display substrate may further include: a plurality of first data signal lines 12 located in the display region AA. The plurality of first data signal lines 12 are in one-to-one correspondence with the fan-out wires 20.

A first data signal line 12 is electrically connected with a corresponding fan-out wire 20 and is arranged in a different layer from the fan-out wire 20 connected thereto.

Figure 4:
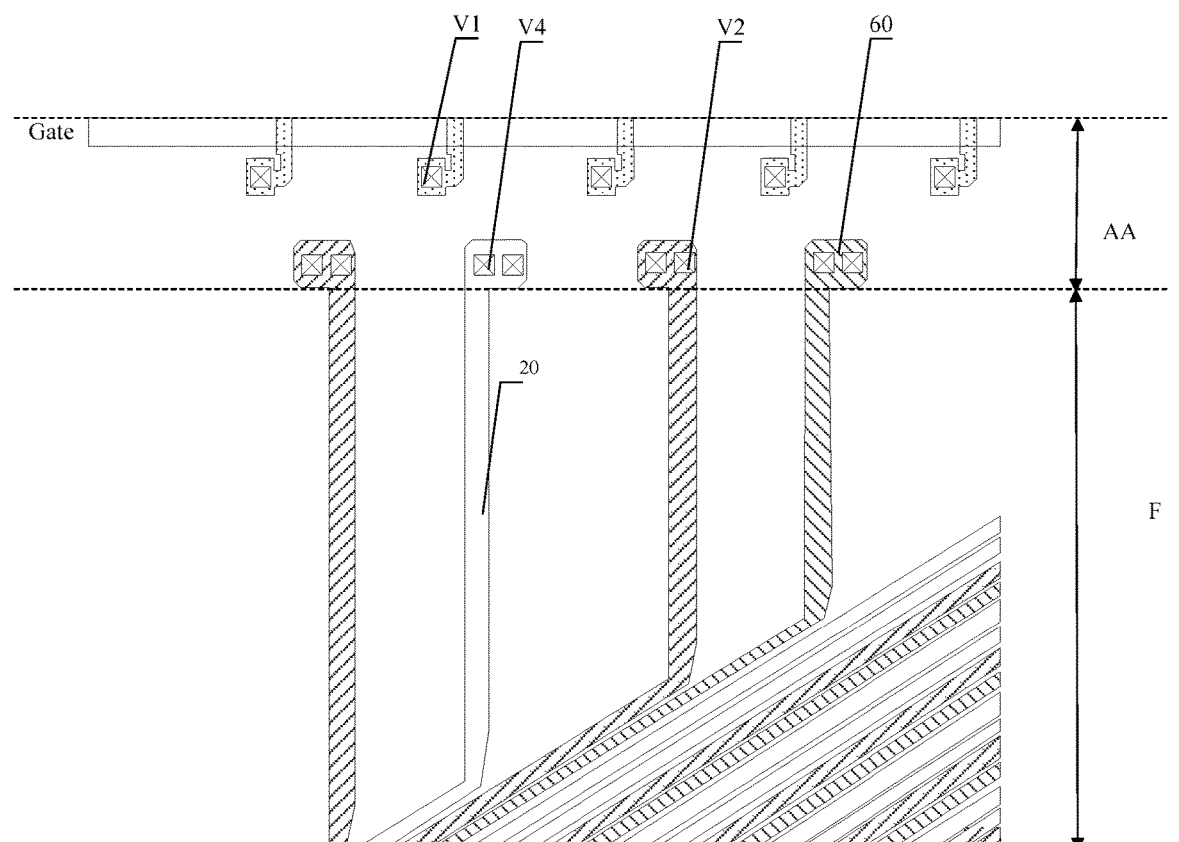
FIG. 4 is a schematic diagram of a structure of an F1 region in a display substrate according to another exemplary embodiment.

In an exemplary embodiment, FIG. 4 is a structural layout of an F1 region in a display substrate according to another exemplary embodiment. As shown in FIG. 4, the display substrate further includes: a plurality of first connecting electrodes 60 located in the display region AA, the plurality of first connecting electrodes 60 being respectively electrically connected with the plurality of first data signal lines 12 and the plurality of fan-out wires 20.

In an exemplary embodiment, the first connecting electrode 60 is arranged in the same layer as the fan-out wire 20 connected with the first connecting electrode 60, and in a different layer from the first data signal line connected with the first connecting electrode 60.

Figure 5:
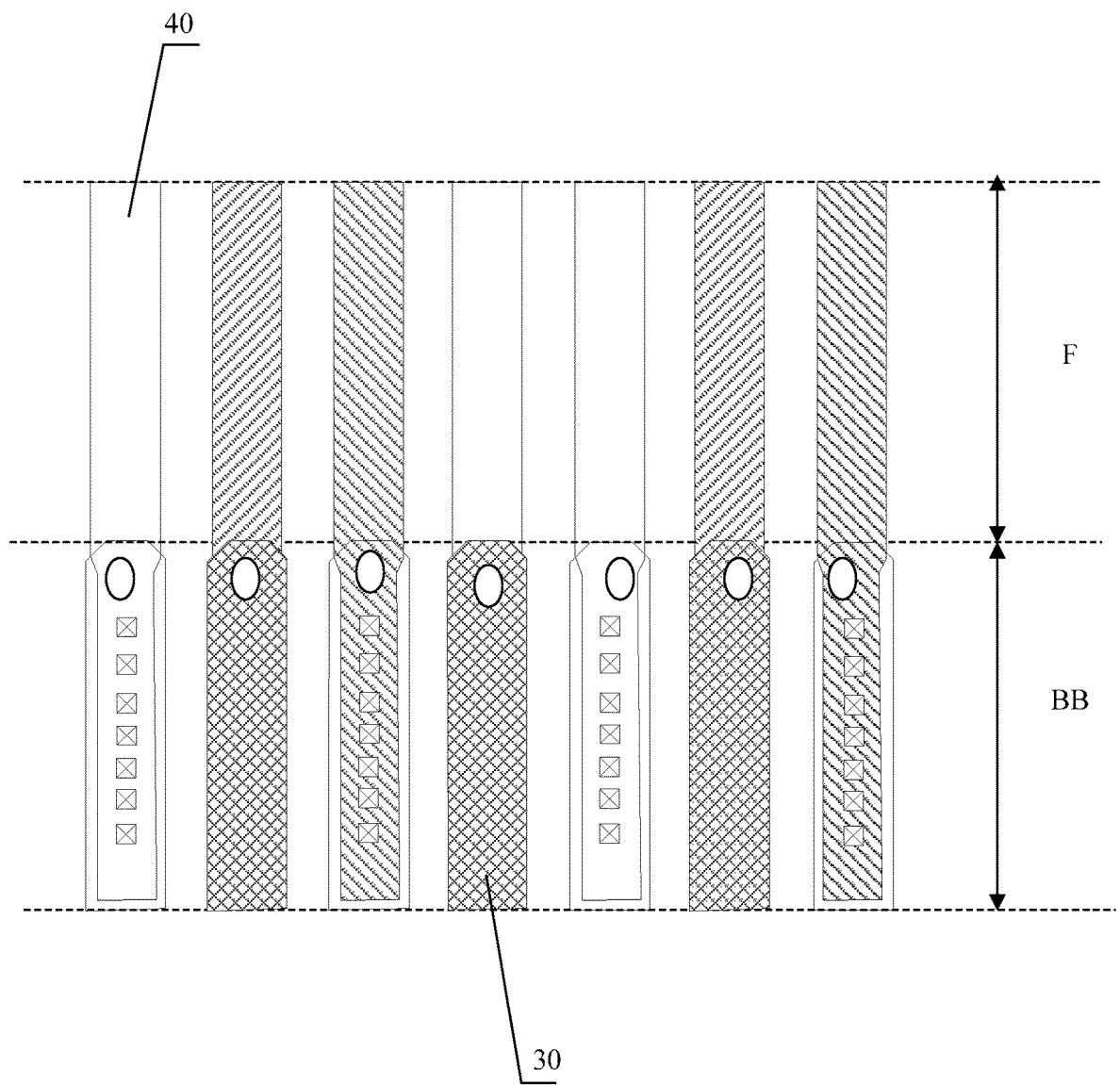
FIG. 5 is a schematic diagram of a structure of an F2 region in a display substrate according to an exemplary embodiment.

In an exemplary embodiment, FIG. 5 is a structural layout of an F2 region in a display substrate according to an exemplary embodiment. As shown in FIG. 5, the display substrate according to an exemplary embodiment further includes second data signal lines 30 located in the bending region BB. A plurality of second data signal lines 30 are electrically connected with the transfer lines 40.

In an exemplary embodiment, a second data signal line 30 is arranged in a different layer from the transfer line 40 and in the same layer as the first data signal line.

Figure 6:
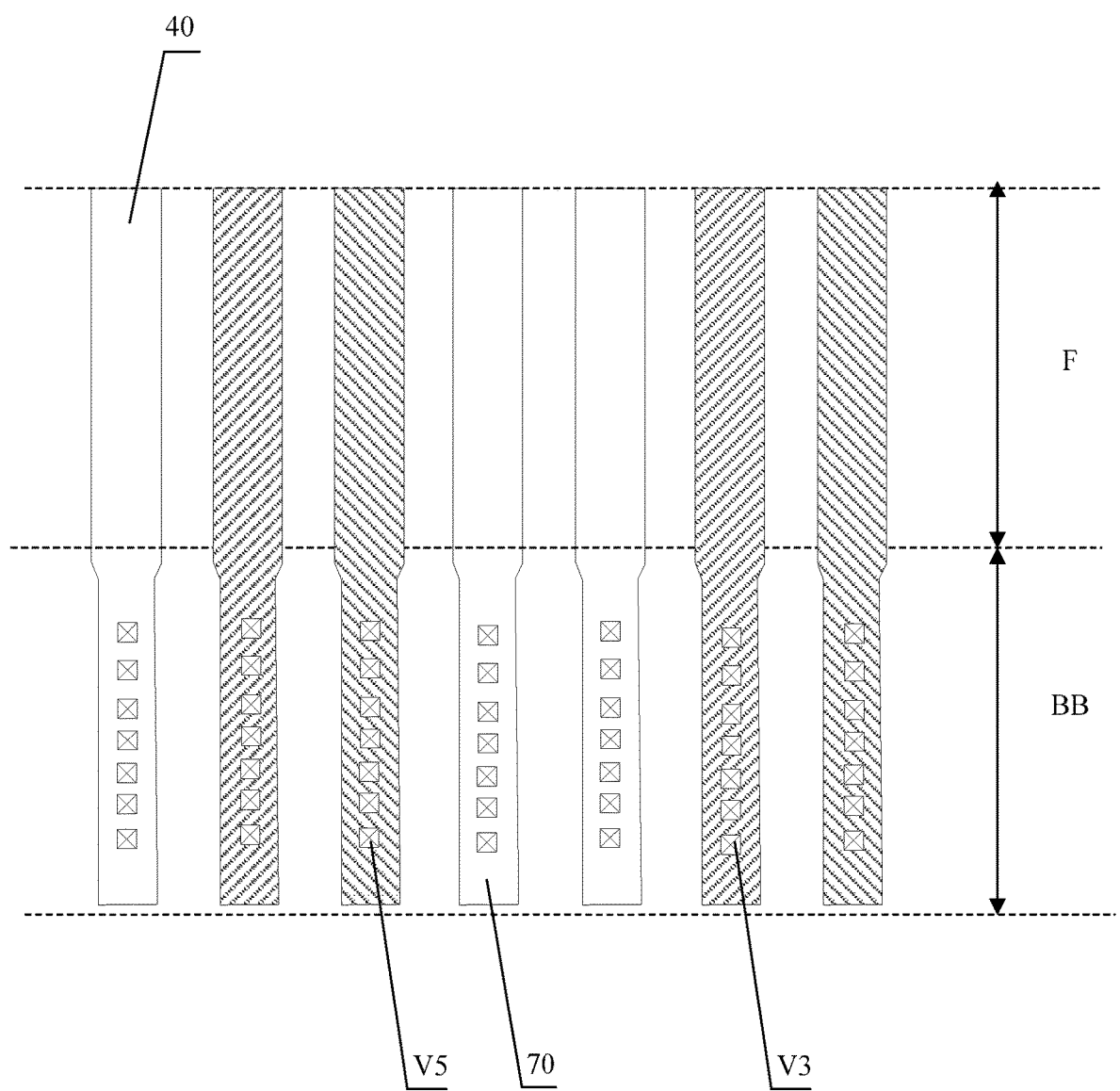
FIG. 6 is a schematic diagram of a structure of an F2 region in a display substrate according to another exemplary embodiment.

In an exemplary embodiment, FIG. 6 is a structural layout of an F2 region in a display substrate according to another exemplary embodiment. As shown in FIG. 6, the display substrate according to an exemplary embodiment further includes: a plurality of second connecting electrodes 70 located in the bending region, the plurality of second connecting electrodes 70 being respectively connected with the plurality of transfer lines 40 and the plurality of second data signal lines 30. The second connecting electrode 70 is arranged in the same layer as the transfer line 40 connected with the second connecting electrode 70, and in a different layer from the second data signal line 30 connected with the second connecting electrode 70.

In an exemplary embodiment, a ratio of the width of the second connecting electrode 70 to the width of the transfer line 40 connected with the second connecting electrode 70 is 0.8 to 1.

In an exemplary embodiment, a ratio of the width of the second data signal line 30 to the width of the second connecting electrode 70 connected with the second data signal line 30 is 1 to 1.2.

In an exemplary embodiment, as shown in FIG. 3, the display substrate may further include: a wire 80 that transmits signals to a scan signal line Gate, a reset signal line and a light emitting control line in the display region.

In an exemplary embodiment, as shown in FIG. 3, the display substrate may further include: a power line VDD that continuously provides a high-level signal.

Figure 7:
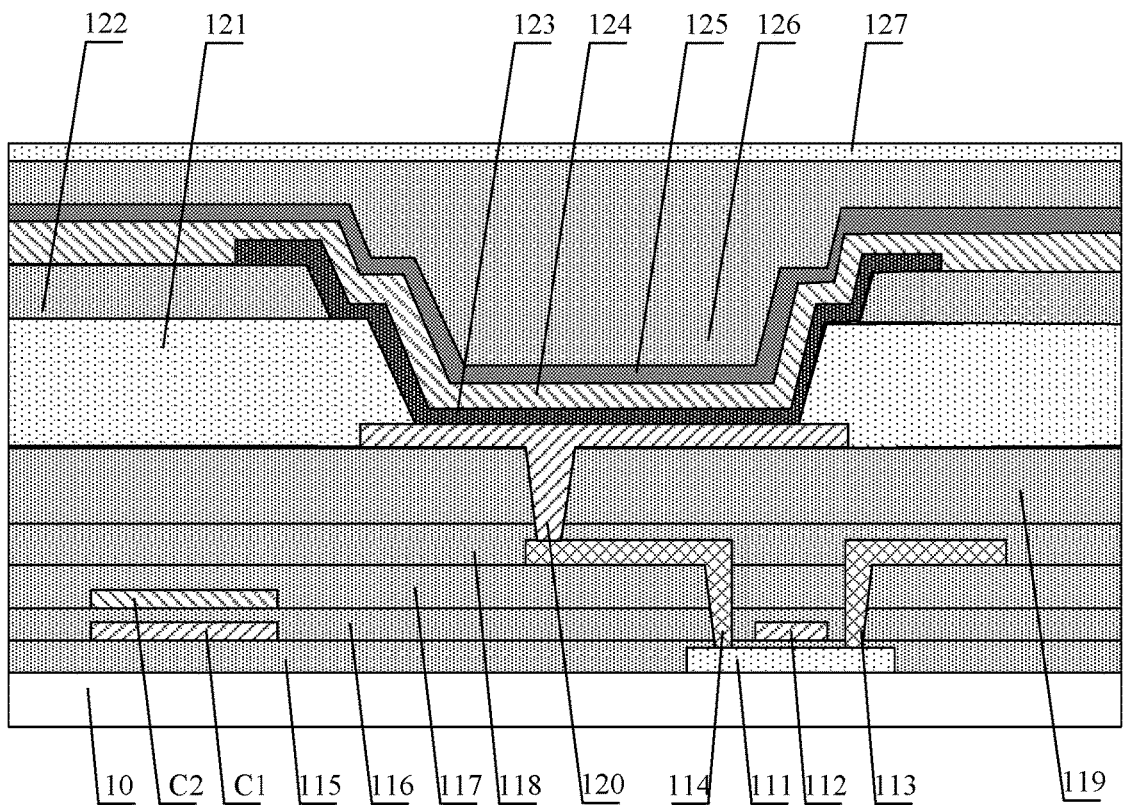
FIG. 7 is a sectional view of a part of a display region of a display substrate according to an exemplary embodiment.

FIG. 7 is a sectional view of a part of a display region of a display substrate according to an exemplary embodiment. As shown in FIGS. 3 and 7, the display substrate further includes: an underlay substrate 10. A plurality of sub-pixels 11 are arranged on the underlay substrate 10, and at least one of the plurality of sub-pixels includes a driving thin film transistor and a storage capacitor. FIG. 7 illustrates an example in which the display substrate is an OLED display substrate.

The driving thin film transistor includes a driving active layer 111 located on the underlay substrate 10, a first insulating layer 115 located on a side of the driving active layer 111 away from the underlay substrate 10, a driving gate electrode 112 located on a side of the first insulating layer 115 away from the underlay substrate 10, a second insulating layer 116 located on a side of the driving gate electrode 112 away from the underlay substrate 10, a third insulating layer 117 located on a side of the second insulating layer 116 away from the underlay substrate 10, and a driving source electrode 113 and a driving drain electrode 114 located on a side of the third insulating layer 117 away from the underlay substrate 10.

The storage capacitor includes a first plate C1 and a second plate C2. The first plate C1 is arranged in the same layer as the driving gate electrode 112. The second plate C2 is located between the second insulating layer 116 and the third insulating layer 117.

In an exemplary embodiment, an orthographic projection of the first plate C1 on the underlay substrate 10 at least partially overlaps with an orthographic projection of the second plate C2 on the underlay substrate 10.

In an exemplary embodiment, the display substrate may further include: a fourth insulating layer 118, a planarization layer 119, a first electrode 120, a pixel definition layer 121, a spacer layer 122, an organic light emitting layer 123, a second electrode 124, a first encapsulation layer 125, a second encapsulation layer 126 and a third encapsulation layer 127 sequentially stacked on the third insulating layer.

In an exemplary embodiment, the underlay substrate may be a rigid underlay substrate or a flexible underlay substrate. The rigid underlay substrate may be, but not limited to, one or more of glass and metal foils. The flexible underlay substrate may be, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, the driving active layer may be made of a semiconductor material, such as polysilicon (e.g., low temperature polysilicon or high temperature polysilicon), amorphous silicon, or indium gallium tin oxide (IGTO).

In an exemplary embodiment, the driving gate electrode, the driving source electrode and the driving drain electrode may be made of a metallic material, such as metallic aluminum or an aluminum alloy. The driving source electrode and the driving drain electrode of the transistor used herein may be symmetrical in structure, so there may be no difference between the driving source electrode and the driving drain electrode in structure.

In an exemplary embodiment, the first electrode may be made of indium tin oxide or zinc tin oxide.

In an exemplary embodiment, the pixel definition layer may be made of polyimide, acrylic or polyethylene terephthalate.

In an exemplary embodiment, the second electrode may be made of any one or more of magnesium (Mg), argentum (Ag), aluminum (Al), copper (Cu) and lithium (Li), or an alloy made of any one or more of the above metals.

In an exemplary embodiment, the display substrate may further include a polarizer.

In an exemplary embodiment, a fan-out wire of an odd ordinal number is arranged in the same layer as the first plate, and a fan-out wire of an even ordinal number is arranged in the same layer as the second plate.

In an exemplary embodiment, a fan-out wire of an odd ordinal number is arranged in the same layer as the second plate, and a fan-out wire of an even ordinal number is arranged in the same layer as the first plate.

In an exemplary embodiment, there is no overlapping area between the orthographic projection of the $i^{th}$ fan-out wire on the underlay substrate and the orthographic projection of the $(i+1)^{th}$ fan-out wire on the underlay substrate, which may avoid signal crosstalk between adjacent fan-out wires, improving the display effect of the display substrate.

In an exemplary embodiment, the first data signal line and the second data signal line are arranged in the same layer as the driving source electrode.

In an exemplary embodiment, as shown in FIG. 1 and FIG. 5, multiple second data signal lines 30 are provided with a plurality of through holes.

In an exemplary embodiment, the plurality of through holes may be round holes or elliptical holes.

In an exemplary embodiment, as shown in FIG. 4 and FIG. 6, the first insulating layer, the second insulating layer and the third insulating layer are provided with a first via hole V1 exposing the driving active layer. The second insulating layer and the third insulating layer are provided with a second via hole V2 exposing the first connecting electrode connected with the $P^{th}$ fan-out wire and a third via hole V3 exposing the second connecting electrode connected with the $P^{th}$ fan-out wire.

The driving source electrode and the driving drain electrode are connected with the driving active layer 111 through the first via hole. The first data signal line connected with the $P^{th}$ fan-out wire is connected with the first connecting electrode 60 connected with the $P^{th}$ fan-out wire through the second via hole V2. The second data signal line connected with the $P^{th}$ fan-out wire is connected with the second connecting electrode connected with the $P^{th}$ fan-out wire through the third via hole V3.

In an exemplary embodiment, the number of second via holes V2 is at least one. When there are a plurality of second via holes V2, the plurality of second via holes are arranged along the first direction. FIG. 4 illustrates an example in which there are two second via holes V2.

In an exemplary embodiment, the number of third via holes V3 is at least one. When there are a plurality of third via holes V3, the plurality of third via holes are arranged along the second direction. FIG. 6 illustrates an example in which there are seven third via holes V3.

In an exemplary embodiment, as shown in FIG. 4 and FIG. 6, the third insulating layer is provided with a fourth via hole V4 exposing the first connecting electrode connected with the $Q^{th}$ fan-out wire and a fifth via hole V5 exposing the second connecting electrode connected with the $Q^{th}$ fan-out wire.

The first data signal line connected with the $Q^{th}$ fan-out wire is connected with the first connecting electrode connected with the $Q^{th}$ fan-out wire through the fourth via hole. The second data signal line connected with the $Q^{th}$ fan-out wire is connected with the second connecting electrode connected with the $Q^{th}$ fan-out wire through the fifth via hole.

In an exemplary embodiment, the number of fourth via holes V4 is at least one. When there are a plurality of fourth via holes, the plurality of fourth via holes are arranged along the first direction. FIG. 4 illustrates an example in which there are two fourth via holes V4.

In an exemplary embodiment, the number of fifth via holes V5 is at least one. When there are a plurality of fifth via holes V5, the plurality of fifth via holes are arranged along the second direction. FIG. 6 illustrates an example in which there are seven fifth via holes V5.

In an exemplary embodiment, P is an odd number smaller than or equal to N and Q is an even number smaller than or equal to N; or P is an even number smaller than or equal to N and Q is an odd number smaller than or equal to N.

In an exemplary embodiment, the first insulating layer, the second insulating layer, the third insulating layer and the fourth insulating layer may be made of any one or more of silicon oxide (SiOx), silicon nitride (SiNx) and silicon oxynitride (SiON), and may be a single layer, multiple layers or a composite layer. The first insulating layer is referred to as a first gate insulating layer, the second insulating layer is referred to as a second gate insulating layer, the third insulating layer is referred to as an interlayer insulating layer, and the fourth insulating layer is referred to as a passivation layer.

The structure of a display substrate according to an exemplary embodiment is described below through the preparation process of the display substrate with reference to FIG. 4 and FIGS. 8 to 12. A "patterning process" includes film layer deposition, photoresist coating, mask exposure, development, etching, and photoresist stripping. Any one or more of sputtering, evaporation and chemical vapor deposition may be used for the deposition, any one or more of spray coating and spin coating may be used for the coating, and any one or more of dry etching and wet etching may be used for the etching. A "thin film" refers to a layer of thin film manufactured from a certain material on an underlay substrate by using a deposition or coating process. If the "thin film" does not need the patterning process in the entire manufacturing process, the "thin film" may also be called a "layer". If the "thin film" needs the patterning process in the entire manufacturing process, the "thin film" is called a "thin film" before the patterning process is performed and is called a "layer" after the patterning process is performed. "A and B being arranged in the same layer" in the present disclosure means that A and B are formed simultaneously through a single patterning process.

Figure 8:
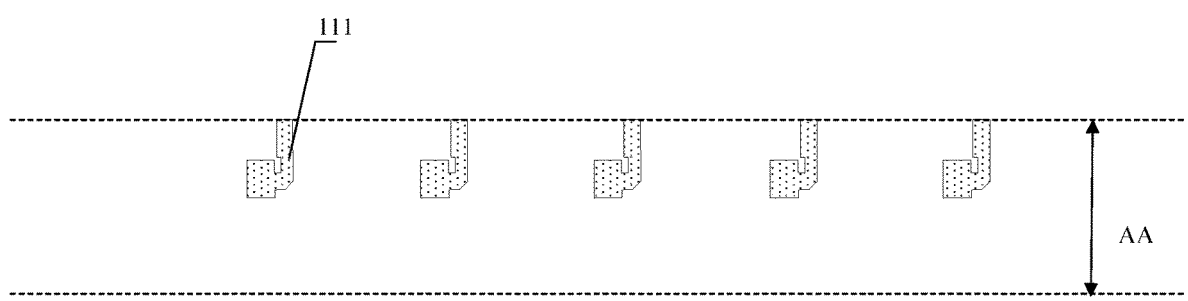
FIG. 8 is a schematic diagram of forming an active layer.

(1) An active layer is formed on an underlay substrate, which includes: depositing a semiconductor thin film on the underlay substrate, and patterning the semiconductor thin film by a patterning process to form a driving active layer 111, as shown in FIG. 8.

Figure 9:
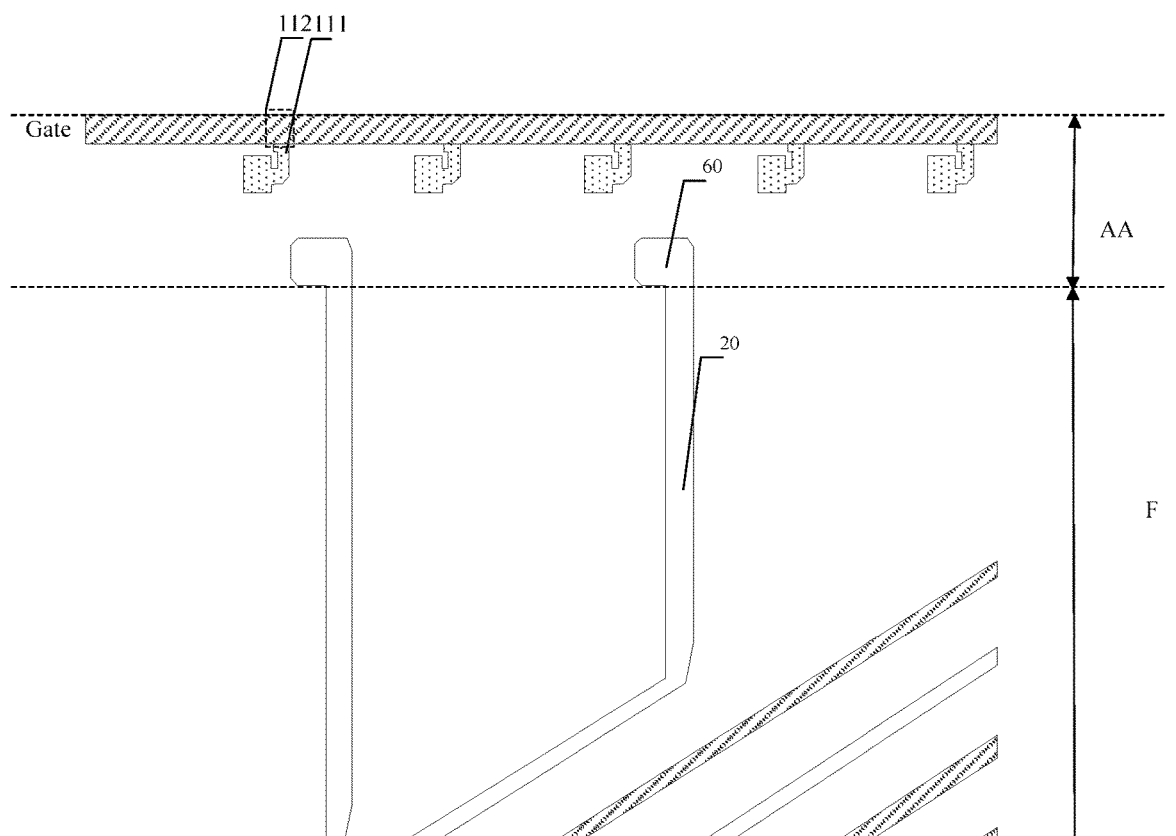
FIG. 9 is a schematic diagram of forming a first metal layer.

(2) A first metal layer is formed, which includes: depositing a first insulating thin film on the underlay substrate on which the active layer has been formed, and patterning the first insulating thin film by a patterning process to form a first insulating layer; and depositing a first metal thin film on the first insulating layer, and patterning the first metal thin film by a patterning process to form a first metal layer. The first metal layer includes: a scan signal line Gate, a light emitting control line, a reset signal line, a driving gate electrode 112 and a first plate located in the display region, a $P^{th}$ fan-out wire 20 located in the fan-out region, and a first connecting electrode 60 located in the display region and a second connecting electrode (not shown in the figure) located in the bending region which are connected with the $P^{th}$ fan-out wire, as shown in FIG. 9.

In an exemplary embodiment, this process further includes a conductivity treatment. The conductivity treatment is to perform plasma treatment on the driving active layer by using the driving gate electrode as a shield after the formation of the first metal layer. The driving active layer in an area shielded by the driving gate electrode serves as a channel region, and the driving active layer in an area not shielded by the first metal layer is treated into a conductive layer to form a conductive source-drain area.

Figure 10:
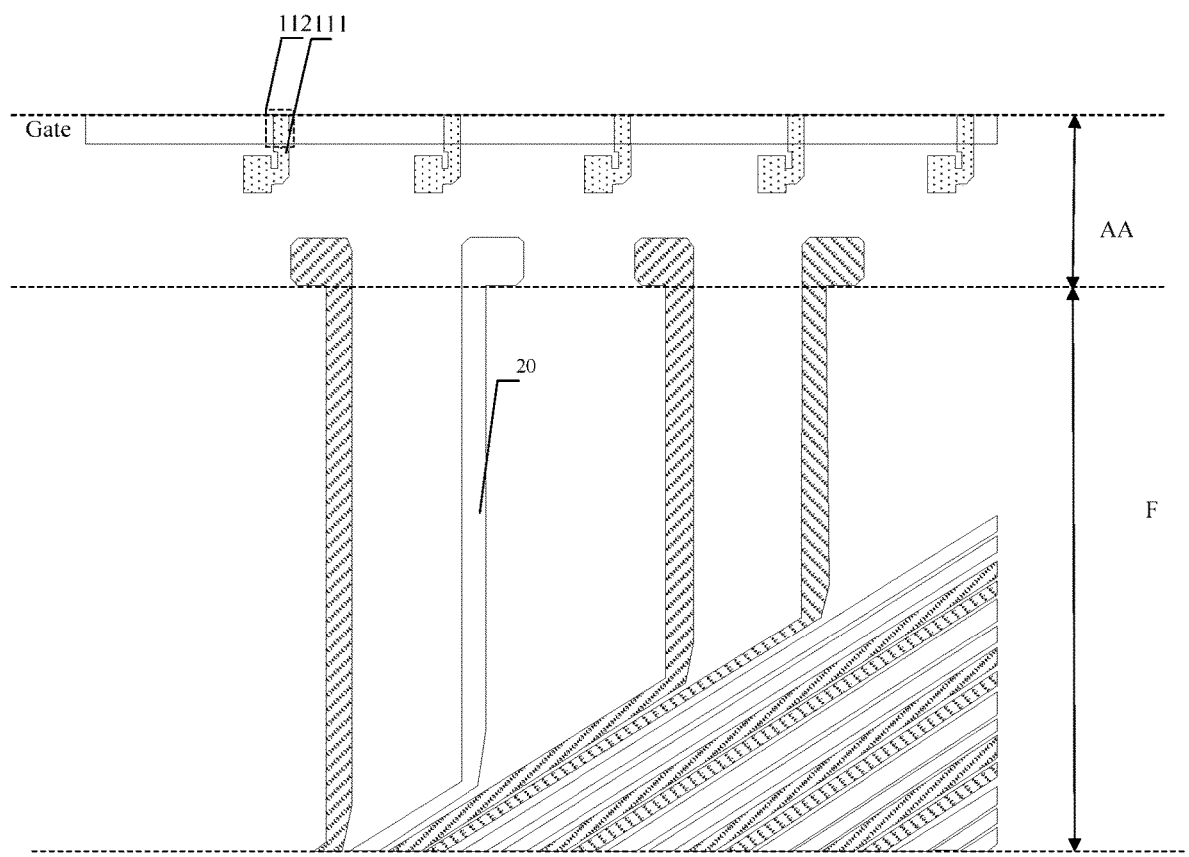
FIG. 10 is a schematic diagram of forming a second metal layer.

(3) A second metal layer is formed, which includes: depositing a second insulating thin film on the underlay substrate on which the first metal layer has been formed, and patterning the second insulating thin film by a patterning process to form a second insulating layer; and depositing a second metal thin film on the underlay substrate on which the second insulating layer has been formed, and patterning the second metal thin film by a patterning process to form a second metal layer. The second metal layer includes: a second plate, a $Q^{th}$ fan-out wire located in the fan-out region, and a first connecting electrode located in the display region and a second connecting electrode located in the bending region which are connected with the $Q^{th}$ fan-out wire, as shown in FIG. 10.

(4) A third insulating layer is formed, which includes: depositing a third insulating thin film on the underlay substrate on which the second metal layer has been formed, and patterning the third insulating thin film by a patterning process to form a third insulating layer. The formed third insulating layer is provided with a plurality of via holes. The plurality of via holes include: a first via hole V1 penetrating the first insulating layer, the second insulating layer and the third insulating layer, a second via hole V2 and a third via hole V3 penetrating the second insulating layer and the third insulating layer, and a fourth via hole and a fifth via hole penetrating only the third insulating layer, as shown in FIG. 4.

In an exemplary embodiment, the first via hole exposes the driving active layer, the second via hole exposes the first connecting electrode connected with the $P^{th}$ fan-out wire, the third via hole exposes the second connecting electrode connected with the $P^{th}$ fan-out wire, the fourth via hole exposes the first connecting electrode connected with the $Q^{th}$ fan-out wire, and the fifth via hole exposes the second connecting electrode connected with the $Q^{th}$ fan-out wire.

Figure 11:
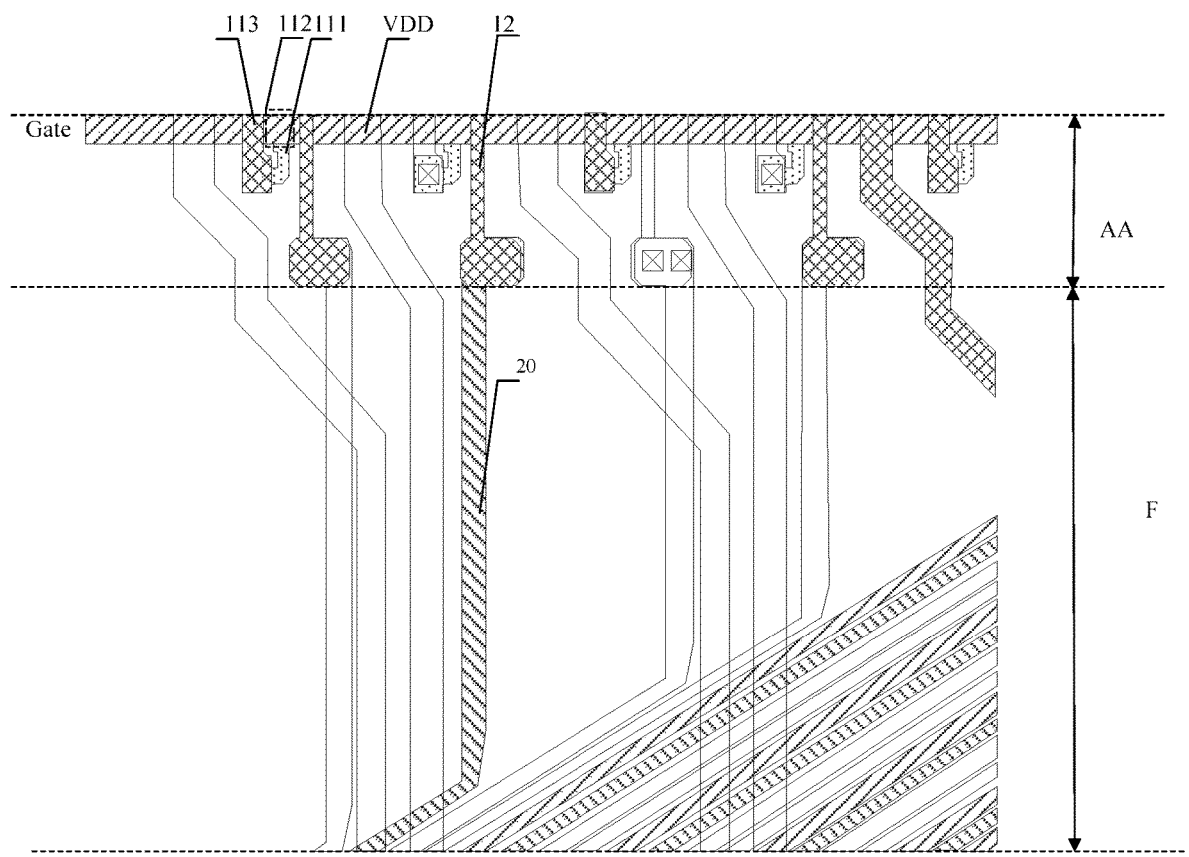
FIG. 11 is a schematic diagram of forming a third metal layer.

(5) A third metal layer is formed, which includes: depositing a third metal thin film on the underlay substrate on which the third insulating layer has been formed, and patterning the third metal thin film by a patterning process to form a third metal layer. The third metal layer includes: a plurality of driving source electrodes 113 and driving drain electrodes 114 located in the display region AA, a first data signal line 12 located in the display region AA, a second data signal line located in the bending region (not shown in the figure), and a first power line VDD, as shown in FIG. 11.

The driving source electrode 113 and the driving drain electrode 114 are connected with the driving active layer through the first via hole; the first data signal line connected with the $P^{th}$ fan-out wire is connected with the first connecting electrode connected with the $P^{th}$ fan-out wire through the second via hole; and the second data signal line connected with the $P^{th}$ fan-out wire is connected with the second connecting electrode connected with the $P^{th}$ fan-out wire through the third via hole. The first data signal line connected with the $Q^{th}$ fan-out wire is connected with the first connecting electrode connected with the $Q^{th}$ fan-out wire through the fourth via hole; and the second data signal line connected with the $Q^{th}$ fan-out wire is connected with the second connecting electrode connected with the $Q^{th}$ fan-out wire through the fifth via hole.

Figure 12:
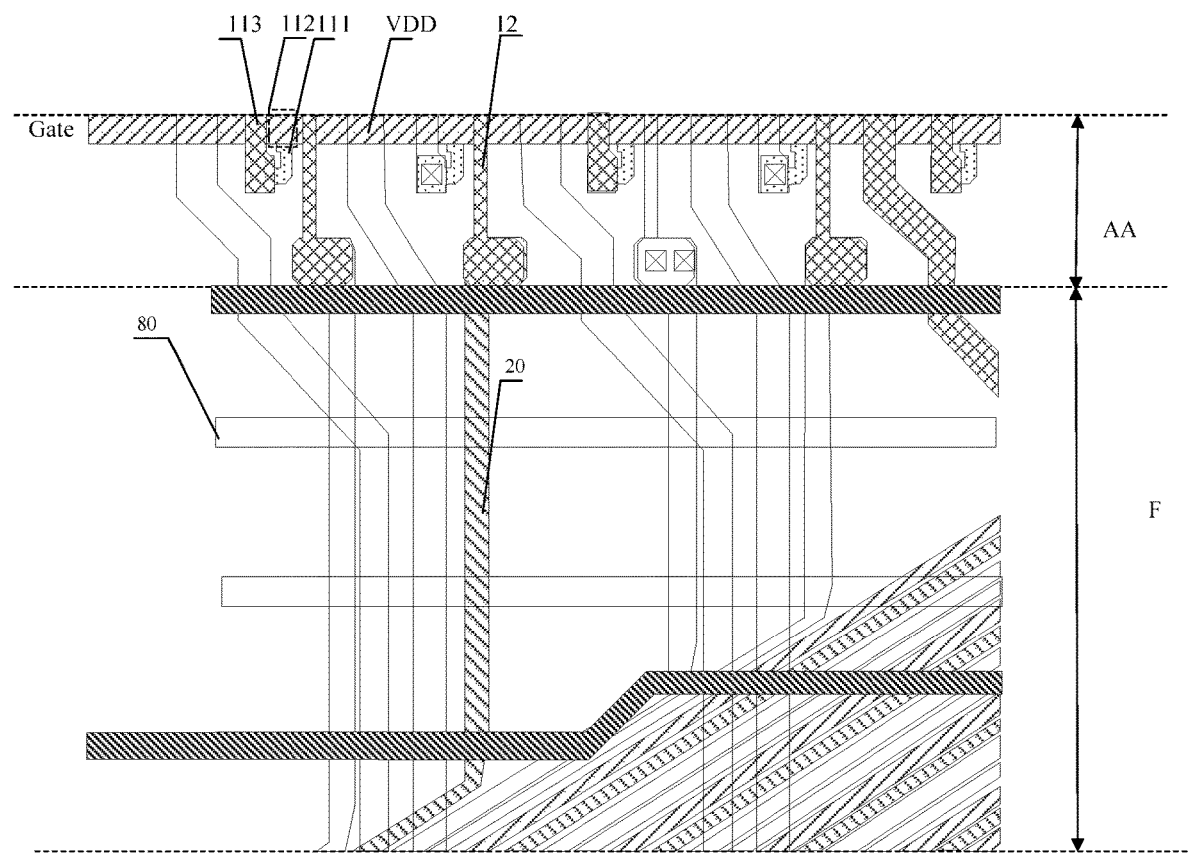
FIG. 12 is a schematic diagram of forming a fourth metal layer.

(6) A fourth metal layer is formed, which includes: depositing a fourth insulating thin film on the underlay substrate on which the third metal layer has been formed, and patterning the fourth insulating thin film by a patterning process to form a fourth insulating layer; and depositing a fourth metal thin film on the underlay substrate on which the fourth insulating layer has been formed, and patterning the fourth metal thin film by a patterning process to form a fourth metal layer. The fourth metal layer includes: a wire 80 that transmits signals to the scan signal line Gate, the reset signal line and the light emitting control line in the display region, as shown in FIG. 12.

(7) A planarization layer is formed, which includes: coating the underlay substrate, on which the fourth metal layer has been formed, with a planarization thin film, and masking, exposing and developing the planarization thin film to form a planarization layer.

(8) A light emitting structure layer and an encapsulation layer are formed, which includes: depositing a transparent conductive thin film on the underlay substrate on which the planarization layer has been formed, and patterning the transparent conductive thin film by a patterning process to form a first electrode; coating the underlay substrate, on which the first electrode has been formed, with a pixel definition thin film and a spacer thin film, and masking, exposing and developing the pixel definition thin film and the spacer thin film to form a pixel definition layer and a spacer layer; coating the underlay substrate, on which the spacer has been formed, with an organic thin film, and masking, exposing and developing the organic thin film to form an organic light emitting layer, depositing a metal thin film on the underlay substrate on which the organic light emitting layer has been formed, and patterning the metal thin film by a patterning process to form a second electrode; depositing a first encapsulation thin film on the underlay substrate on which the second electrode has been formed, and patterning the first encapsulation thin film by a patterning process to form a first encapsulation layer; coating the underlay substrate, on which the first encapsulation layer has been formed, with a second encapsulation thin film, and masking, exposing and developing the second encapsulation thin film to form a second encapsulation layer; and coating the underlay substrate, on which the second encapsulation layer has been formed, with a third encapsulation thin film, and masking, exposing and developing the third encapsulation thin film to form a third encapsulation layer.

An embodiment of the present disclosure further provides a display apparatus, including a display substrate.

In an exemplary embodiment, the display apparatus may be a product or component with any display function, such as a display, a television, a mobile phone, a tablet computer, a navigator, a digital photo frame, or a wearable display product.

In an exemplary embodiment, when the display substrate is an array substrate, the display apparatus may further include a backlight module for providing backlight.

The display substrate is the display substrate according to any of the preceding embodiments, and has similar implementation principles and implementation effects, which will not be described further here.

The accompanying drawings of the present disclosure only involve the structures involved in the embodiments of the present disclosure, and for the other structures, reference may be made to conventional designs.

For clarity, in the accompanying drawings for describing the embodiments of the present disclosure, the thickness and dimension of a layer or a micro structure are enlarged. It is to be understood that when an element such as a layer, film, region or substrate is described as being "on" or "under" another element, it can be "directly" located "on" or "under" said another element, or there may be an intermediate element.

Although the implementations disclosed in the present disclosure are as described above, the described contents are only the implementations adopted for facilitating understanding of the present disclosure, which are not intended to limit the present disclosure. Any person skilled in the art to which the present disclosure pertains may make any modifications and variations in the form and details of implementation without departing from the spirit and scope of the present disclosure. Nevertheless, the scope of patent protection of the present disclosure shall still be subject to the scope defined by the appended claims.

The invention claimed is:

1. A display substrate, comprising: a display region and a non-display region surrounding the display region, the non-display region comprising a fan-out region and a bending region, the bending region being located at a side of the fan-out region away from the display region;

a plurality of sub-pixels located in the display region;
a plurality of first data signal lines, located in the display region, electrically connected with the plurality of sub-pixels, and configured to provide data signals to the plurality of sub-pixels;
a plurality of fan-out wires, located in the fan-out region and arranged sequentially along a first direction, the plurality of fan-out wires being electrically connected with the plurality of first data signal lines;
a plurality of second data signal lines, located in the bending region and arranged sequentially along the first direction, the plurality of second data signal lines being electrically connected with the plurality of fan-out wires; and
a plurality of transfer lines, located in the fan-out region and between the plurality of fan-out wires and the plurality of second data signal lines, the plurality of transfer lines electrically connecting the plurality of fan-out wires with the plurality of second data signal lines,
wherein a ratio of a width of at least part of the plurality of transfer lines to a width of the plurality of fan-out wires is 0.5 to 5.5,
wherein the display substrate further comprises a plurality of first connecting electrodes located in the display region, the plurality of first connecting electrodes are respectively connected with the plurality of first data signal lines and the plurality of fan-out wires; and
a first connecting electrode is arranged in a same layer as a fan-out wire connected with the first connecting electrode, and in a different layer from a first data signal line connected with the first connecting electrode.

2. The display substrate according to claim 1, wherein at least one of the plurality of fan-out wires comprises:
a first connecting portion, a second connecting portion and a third connecting portion arranged along a second direction, the second connecting portion being located between the first connecting portion and the third connecting portion and connecting the first connecting portion with the third connecting portion, an angle between the first connecting portion and the second connecting portion being greater than 90 degrees and smaller than or equal to 180 degrees, and an angle between the second connecting portion and the third connecting portion being greater than 90 degrees and smaller than or equal to 180 degrees;
a ratio of a width of the third connecting portion to the width of the at least part of the plurality of transfer lines being 1 to 2; and the first direction intersecting the second direction.

3. The display substrate according to claim 2, wherein a ratio of the width of the at least part of the plurality of transfer lines to a width of at least part of second connecting portions is 2 to 5.5.

4. The display substrate according to claim 2, wherein the width of the at least part of the plurality of transfer lines is equal to the width of the third connecting portion.

5. The display substrate according to claim 2, wherein the display region is in a shape of a rounded polygon, the display region is divided into a straight edge region and a corner region, a boundary of the display region in the corner region is arc-shaped, and a ratio of a width of the first connecting portion to a width of the second connecting portion in a fan-out wire close to the corner region is 2 to 5.5.

6. The display substrate according to claim 5, wherein a ratio of the width of the first connecting portion of the fan-out wire close to the corner region to a width of a first data signal line is 2 to 3.

7. The display substrate according to claim 1, wherein an $i^{th}$ fan-out wire is arranged in a different layer from an $(i+1)^{th}$ fan-out wire, $1 \leq i \leq N$, N being a quantity of the fan-out wires; and
a transfer line is arranged in a same layer as a fan-out wire connected with the transfer line.

8. The display substrate according to claim 7, wherein fan-out wires of odd ordinal numbers are arranged in a same layer and fan-out wires of even ordinal numbers are arranged in a same layer.

9. The display substrate according to claim 1, wherein the display substrate further comprises a plurality of second connecting electrodes located in the bending region, the plurality of second connecting electrodes are respectively electrically connected with the plurality of transfer lines and the plurality of second data signal lines;
a second connecting electrode is arranged in a same layer as a transfer line connected with the second connecting electrode, and in a different layer from a second data signal line connected with the second connecting electrode; and
a ratio of a width of the second connecting electrode to a width of the transfer line connected with the second connecting electrode is 0.8 to 1; and a ratio of a width of the second data signal line to the width of the second connecting electrode connected with the second data signal line is 1 to 1.2.

10. The display substrate according to claim 8, wherein the display substrate further comprises an underlay substrate on which the plurality of sub-pixels are arranged, at least one of the plurality of sub-pixels comprises a driving thin film transistor and a storage capacitor;
the driving thin film transistor comprises a driving active layer located on the underlay substrate, a first insulating layer located on a side of the driving active layer away from the underlay substrate, a driving gate electrode located on a side of the first insulating layer away from the underlay substrate, a second insulating layer located on a side of the driving gate electrode away from the underlay substrate, a third insulating layer located on a side of the second insulating layer away from the underlay substrate, and a driving source electrode and a driving drain electrode located on a side of the third insulating layer away from the underlay substrate; and
the storage capacitor comprises a first plate and a second plate; the first plate is arranged in a same layer as the driving gate electrode, the second plate is located between the second insulating layer and the third insulating layer, and an orthographic projection of the first plate on the underlay substrate at least partially overlaps with an orthographic projection of the second plate on the underlay substrate.

11. The display substrate according to claim 10, wherein the fan-out wires of odd ordinal numbers are arranged in a same layer as the first plate, and the fan-out wires of even ordinal numbers are arranged in a same layer as the second plate;
or, the fan-out wires of odd ordinal numbers are arranged in a same layer as the second plate, and the fan-out wires of even ordinal numbers are arranged in a same layer as the first plate;
there is no overlapping area between an orthographic projection of the $i^{th}$ fan-out wire on the underlay substrate and an orthographic projection of the $(i+1)^{th}$ fan-out wire on the underlay substrate.

12. The display substrate according to claim 10, wherein the first data signal lines and the second data signal lines are arranged in a same layer as the driving source electrode.

13. The display substrate according to claim 10, wherein the plurality of second data signal lines are provided with a plurality of through holes; and the plurality of through holes are round holes or elliptical holes.

14. The display substrate according to claim 1, wherein the display substrate further comprises a driving chip and a plurality of third data signal lines located at a side of the bending region away from the fan-out region; and the driving chip is electrically connected with the plurality of second data signal lines through the plurality of third data signal lines.

15. A display apparatus, comprising the display substrate according to claim 1, and the display substrate is an array substrate.

16. A display apparatus, comprising the display substrate according to claim 2, and the display substrate is an array substrate.

17. A display apparatus, comprising the display substrate according to claim 3, and the display substrate is an array substrate.

18. A display apparatus, comprising the display substrate according to claim 4, and the display substrate is an array substrate.

19. A display apparatus, comprising the display substrate according to claim 5, and the display substrate is an array substrate.

\* \* \* \* \*